(12) United States Patent
Offeringa

(10) Patent No.: US 9,786,585 B2
(45) Date of Patent: Oct. 10, 2017

(54) LEAD-FRAME

(71) Applicant: NXP B.V., Eindhoven (NL)

(72) Inventor: Pieter Offeringa, Nijmegen (NL)

(73) Assignee: NXP B.V., Eindhoven (NL)

( * ) Notice: Subject to any disclaimer, the term of this patent is extended or adjusted under 35 U.S.C. 154(b) by 67 days.

(21) Appl. No.: 14/691,100

(22) Filed: Apr. 20, 2015

(65) Prior Publication Data

US 2016/0307825 A1   Oct. 20, 2016

(51) Int. Cl.
| | | |
|---|---|---|
| *H01L 23/495* | (2006.01) | |
| *H01L 21/56* | (2006.01) | |
| *H01L 21/3205* | (2006.01) | |
| *H01L 21/48* | (2006.01) | |

(52) U.S. Cl.
CPC .. *H01L 23/49582* (2013.01); *H01L 21/32051* (2013.01); *H01L 21/563* (2013.01); *H01L 23/49541* (2013.01); *H01L 21/4842* (2013.01)

(58) Field of Classification Search
CPC  H01L 21/563; H01L 21/4825; H01L 23/4951
USPC ........................................ 257/666, 670, 676
See application file for complete search history.

(56) References Cited

U.S. PATENT DOCUMENTS

| | | | |
|---|---|---|---|
| 2012/0112333 A1* | 5/2012 | Liu | ..................... H01L 21/4828 257/676 |
| 2014/0306330 A1* | 10/2014 | Williams | .......... H01L 23/49541 257/675 |
| 2015/0035166 A1* | 2/2015 | Letterman, Jr. ... | H01L 21/02021 257/774 |
| 2016/0126162 A1 | 5/2016 | Leung et al. | |
| 2016/0126169 A1 | 5/2016 | Leung et al. | |

FOREIGN PATENT DOCUMENTS

| | | |
|---|---|---|
| DE | 102006015241 A1 | 6/2007 |
| EP | 2284886 A2 | 2/2013 |
| EP | 2284886 A3 | 2/2013 |

OTHER PUBLICATIONS

Extended European Search Report for Patent Appln. No. 16166084.0 (Sep. 14, 2016).

* cited by examiner

*Primary Examiner* — David Vu
*Assistant Examiner* — Brandon Fox

(57) ABSTRACT

One example discloses a lead-frame, comprising: a die-pad having a die coupling surface; a set of terminals each having an outer terminal edge and an inner terminal edge; wherein the outer terminal edge faces away from the die-pad and the inner terminal edge faces toward the die-pad; and a terminal connector having a first side coupled to the inner terminal edge and a second side coupled to the die-pad.

20 Claims, 6 Drawing Sheets

LEAD-FRAME

The present specification relates to lead-frames and methods for manufacturing of semiconductors using lead-frames.

Techniques for electrically and/or mechanically bonding lead-frames to printed circuit boards are important. Such lead-frames may have leads or be lead-less. Many lead-frames are made of a copper-alloy. Bare-Cu, however, tends to corrode over time, which negatively affects the electrical and/or mechanical connections between the lead-frame and printed circuit boards to which it is attached. Bare-Cu may also not wet well during soldering. Electroplating a bare-copper (Cu) lead-frame is one technique for enabling solder to be used to bond the lead-frame to a printed circuit board.

One example technique for electroplating a lead-frame includes using an outer lead-frame to apply an electroplating electrical potential. Outer lead-frames can be in a form of a ring of metal surrounding a lead-frame's terminals and die-pad. The outer lead-frames also are used to connect lead-frames together, thereby forming an array of lead-frames. Electroplating is performed by connecting such an array of outer lead-frames to an electrical potential and which then attracts a plating metal to cover the surfaces of the lead-frame. The outer lead-frame is then separated from the terminals and die-pad during a singulation process using either a dicing-saw or a laser, in two examples. Such a technique however leaves the outward edges of the terminals as exposed bare-Cu which, for the reasons mentioned above, may either not properly wet during solder reflow and/or may lead to insufficiently-high (i.e. too low) formed solder joint fillets during attachment of a package to a printed circuit board.

Another example technique for electroplating a lead-frame includes dimpling the lead-frame. Dimpling involves deforming a lead-frame's terminals or leads thereby creating a dimple which increases a surface area that can be electroplated. Dimpled lead-frames, however, may also suffer from insufficiently high solder joint formation and also leaves the outward edges of the terminals as exposed bare-Cu.

An additional example technique for electroplating a lead-frame includes half-cutting the lead-frame leads. In alternate embodiments the lead-frame leads can be partially cut to a variety of depts such as ⅓ or ⅔ deep. Using this technique the lead-frame leads are cut with a dicing blade to a depth which is ½ the thickness of the lead. This leaves the other ½ thickness of the terminals connected to the lead-frame so that the lead-frame can be electroplated. After electroplating the lead-frame, a $2^{nd}$ saw pass, fully cuts the remaining ½ cut lead. Such a technique only enables a partial plating (~½ of the vertical terminal connection) (i.e. there is electroplating only in the ½ cut area which was sawed in the $1^{st}$ pass). Also controlling the depth of the $1^{st}$ ½ cut is potentially difficult, especially if the lead-frame or packaged lead-frame is warped.

Each of these electroplating techniques leaves bare-Cu edges that can either prevent effective solder reflow and/or corrode, thereby interfering with the electrical or mechanical bonding of the lead-frame to a printed circuit board.

SUMMARY

According to an example embodiment, a lead-frame, comprises: a die-pad having a die coupling surface; a set of terminals each having an outer terminal edge and an inner terminal edge; wherein the outer terminal edge faces away from the die-pad and the inner terminal edge faces toward the die-pad; and a terminal connector having a first side coupled to the inner terminal edge and a second side coupled to the die-pad.

In another example embodiment, the terminals include a bond-wire coupling surface.

In another example embodiment, the set of terminals includes: a first terminal positioned on a first side of the die-pad; and a second terminal positioned on a second side of the die-pad opposite to the first side.

Another example embodiment, further comprises: a tie-bar coupled to the die-pad and configured to couple to a second die-pad.

Another example embodiment, further comprises: a second die-pad; and a tie-bar coupling the first die-pad to the second die-pad.

Another example embodiment, further comprises: an outer lead-frame coupled to the outer terminal edge of the terminals.

In another example embodiment, the lead-frame is at least partially surrounded by an encapsulant.

Another example embodiment, further comprises: a die coupled to the die-pad; a bond-wire coupling the die to one of the terminals; and the terminal connector electrically couples one of the terminals to the die-pad or a tie-bar.

Another example embodiment, further comprises: an electroplated layer covering the lead-frame.

In another example embodiment, the lead-frame includes an outer lead-frame portion; and further comprises, a tie-bar coupling the first die-pad to the outer lead-frame portion.

In another example embodiment, an additional cut will expose an edge of the terminals to enable electroplating.

According to a next example embodiment, a lead-frame, comprises: a die-pad having a die coupling surface; a set of terminals each having an outer terminal edge and an inner terminal edge; wherein the outer terminal edge faces away from the die-pad and the inner terminal edge faces toward the die-pad; and a terminal connector including: a first partial terminal connector portion coupled to the terminal; a second partial terminal connector portion coupled to the die-pad or a tie-bar; and wherein the first and second partial connector portions are separated by a first cut.

In another example embodiment, the cut electrically isolates the terminal from the die-pad or the tie-bar.

In another example embodiment, the cut is configured to expose an edge on both the first and second partial connector portions.

In another example embodiment, the edges exposed are copper.

In another example embodiment, the set of terminals includes a first row of terminals on a first side of the die-pad, and a second row of terminals on a second side of the die-pad; and the first row of terminals are separated from the die-pad by the first cut; and the second row of terminals are separated from the die-pad by a second cut.

In another example embodiment, the first and second cuts are substantially parallel to each other.

According to yet another example embodiment, an article of manufacture comprising at least one non-transitory, tangible machine readable storage medium containing executable machine instructions for processing a lead-frame, wherein the instructions comprise: selecting a lead-frame, wherein the lead-frame includes: a die-pad having a die coupling surface; a set of terminals, surrounding the die-pad, each terminal having an outer terminal edge and an inner terminal edge; wherein the outer terminal edge faces away from the die-pad and the inner terminal edge faces toward the die-pad; and a set of terminal connectors each having a first side coupled to the inner terminal edge of one of the terminals and a second side coupled to the die-pad; applying a die to the die coupling surface; connecting a set of bond-wires between the die and the set of terminals; encapsulating the lead-frame, die and bond-wires; and wherein the die-pad, at least two of the terminals, and at least two of the bond-wires are held at a same electrical potential by the terminal connectors.

Another example embodiment, further includes instructions for: electroplating; and cutting through at least one of the terminals or terminal connectors after encapsulating.

In another example embodiment, the set of terminals includes a first row of terminals on a first side of the die-pad, and a second row of terminals on a second side of the die-pad; and further includes instructions for: cutting through a first set of terminal connectors coupling the first row of terminals to the die-pad; and cutting through a second set of terminal connectors coupling the second row of terminals to the die-pad.

Another example embodiment, further includes instructions for: applying an electrical potential to the lead-frame; and electroplating the lead-frame.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings, in which:

Figure 1:
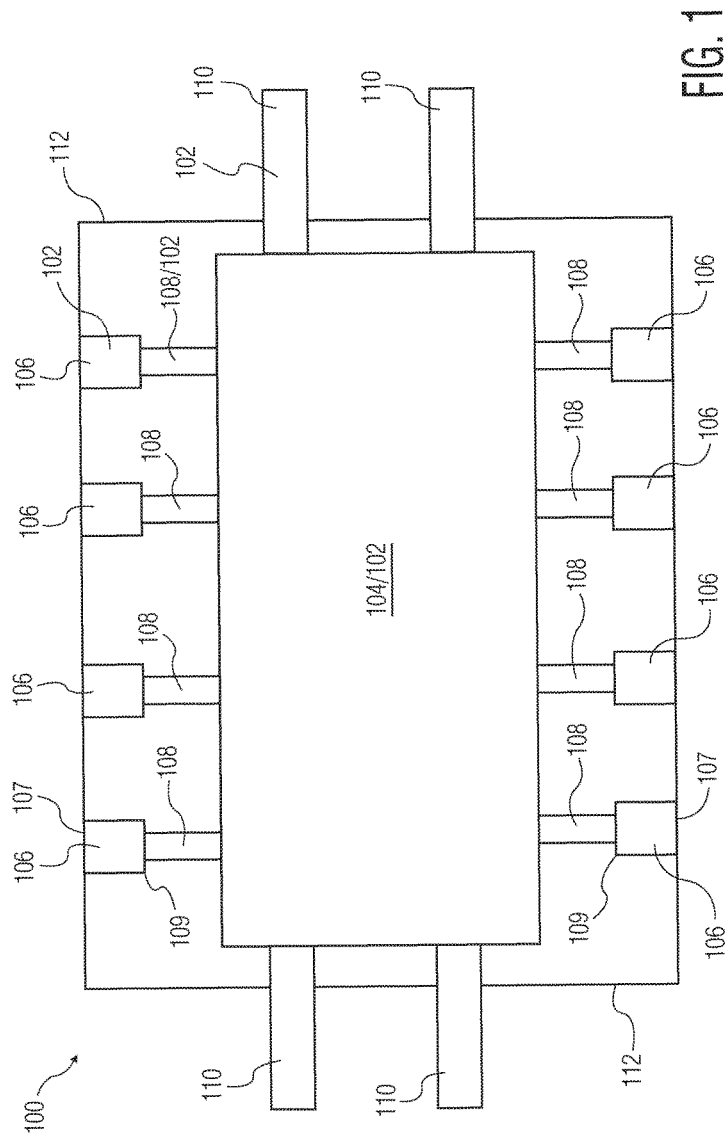
FIG. 1 is an example inner lead-frame portion.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

An example technique for electroplating a lead-frame is now discussed which fully electroplates the outward edges of a set of terminals on the lead-frame. This technique ensures that an entire outward facing edge of a terminal is properly wet during solder reflow and that the solder joint fillets are sufficiently-high. While this technique best applies to lead-less chip packages, in occasional cases these techniques could be applied to packages with leads.

FIG. 1 is an example inner lead-frame portion 102. The inner lead-frame portion 102 is part of a lead-frame that also includes an outer lead-frame portion (not shown). The inner lead-frame portion 102 includes a die-pad 104 having a die coupling surface, a terminal 106 having an outer terminal edge 107 and an inner terminal edge 109, a terminal connector 108 and a tie-bar 110. The inner lead-frame portion 102 can then be wholly or partially surrounded by an encapsulant 112.

The outer terminal edge 107 of the terminal 106 faces away from the die-pad 104 and the terminal's 106 inner terminal edge 109 faces toward the die-pad 104. The terminal connector 108 has a first side coupled to the inner terminal edge 109 and a second side coupled to the die-pad 104. In one example embodiment the terminals 106 include a bond-wire coupling surface.

In one example embodiment the set of terminals 106 includes a first terminal 106 positioned on a first side of the die-pad 104, and a second terminal 106 positioned on a second side of the die-pad 104 opposite to the first side.

The tie-bar 110 in one example embodiment couples an array of die-pads 104 together.

As mentioned above, the inner lead-frame portion 102 in one example embodiment was previously coupled to the outer lead-frame portion (not shown) which surrounded and connected to either the terminals 106 and/or the tie-bars 110. The outer lead-frame portion connected to the terminals 106 is cut from the inner lead-frame portion 102 prior to electroplating, thus allowing full electroplating of the outer terminal edge 107 of the terminal 106 during the electroplating process. The outer lead-frame portion however remains attached to the inner lead-frame portion 102 and terminals 106 via the tie-bars 110, until a later back-end singulation step is performed.

In one example embodiment a die (e.g. a semiconductor chip) (not shown) is coupled (e.g. glued) to the die-pad 104. Bond-wires (not shown) couple the die to the terminals 106. The terminal connectors 108 electrically couple the terminals 106 to the die-pad 104, which means that all of the terminals 106, bond-wires, and terminal connectors 108 are at a same electrical potential since they are coupled to each other without other active or passive discrete electrical components in between. At least some of the inner lead-frame portion 102 is then surrounded by an encapsulant 112, thereby forming a package.

Figure 2:
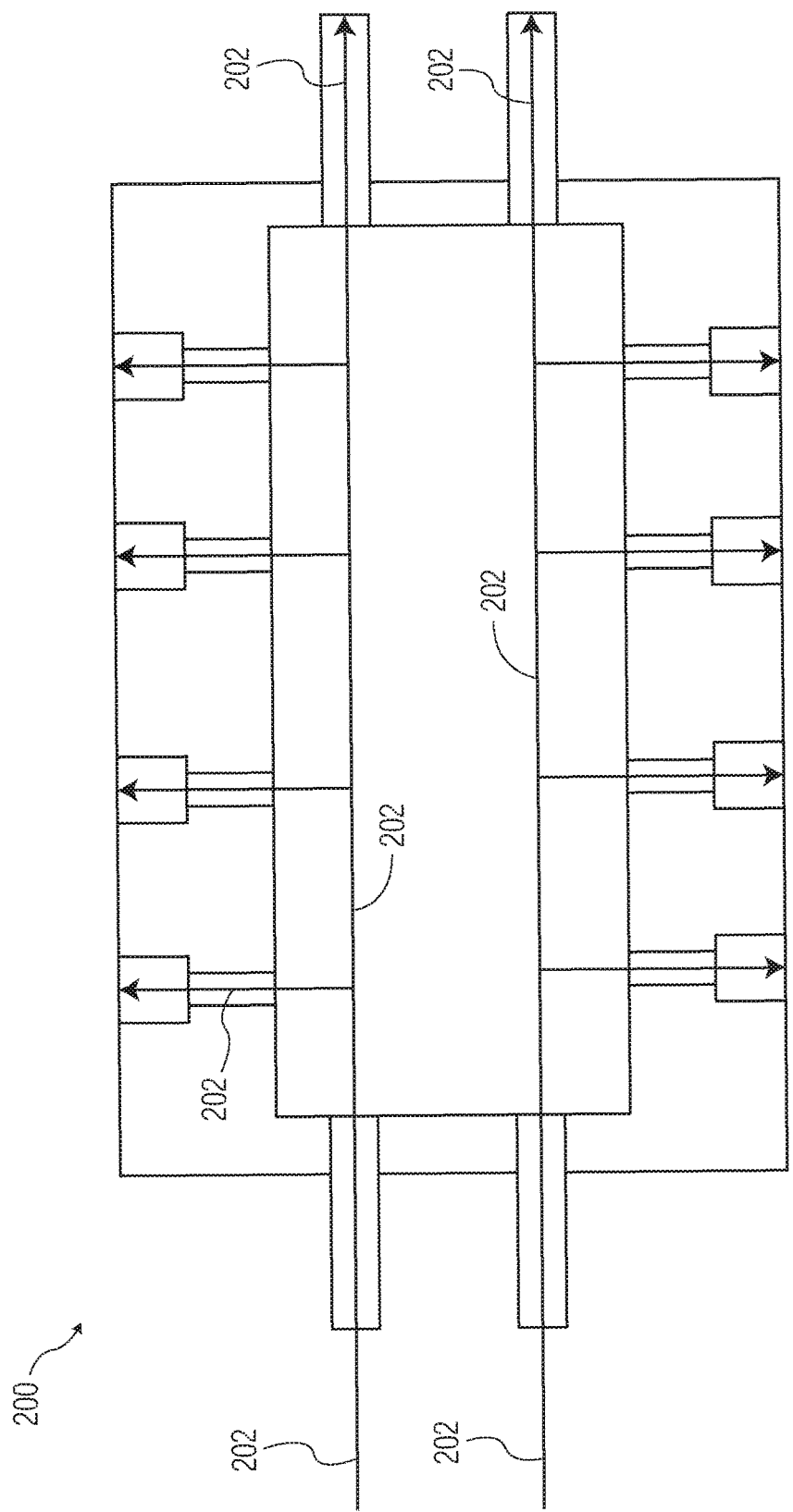
FIG. 2 is an example electrical circuit within the inner lead-frame portion.

FIG. 2 is an example electrical circuit 200 within the inner lead-frame portion 102. So that the outer terminal edge 107 (i.e. outer face) of the terminals 106 can be fully electroplated, the outer lead-frame portion connected to the terminals 106 is first strip sawed from the inner lead-frame portion 102. As mentioned above, the outer lead-frame portion however remains attached to the inner lead-frame portion 102 and terminals 106 via the tie-bars 110 until a later singulation step.

To enable electroplating of the inner lead-frame portion 102, including the outer terminal edge 107 (i.e. outer face) of the terminals 106, the electrical circuit 200 includes an electrical path 202 which holds all of the terminals 106, terminal connectors 108, tie-bars 110 and die-pads 104 at a single electrical potential. The single electrical potential applied at one or more positions on the lead-frame enables the inner lead-frame portion 102, including the outer terminal edge 107 (i.e. outer face) of the terminals 106, to be electroplated. Thus the inner lead-frame portion 102 includes an electrical connection to the terminals 106 to enable electroplating of the other faces of the terminals 106, even after the outer portion of the lead-frame is cut from the terminals 106 and/or tie-bars 110. As mentioned above, electroplating enables better solder reflow and inhibit corrosion.

Since the all of the terminals 106, bond-wires, and terminal connectors 108 are at a same electrical potential, as discussed above, the die, in one example embodiment, will not be capable of operating until the terminals 106 are electrically separated from the die-pad 104, which electrically ties them to the same electrical potential.

Figure 3:
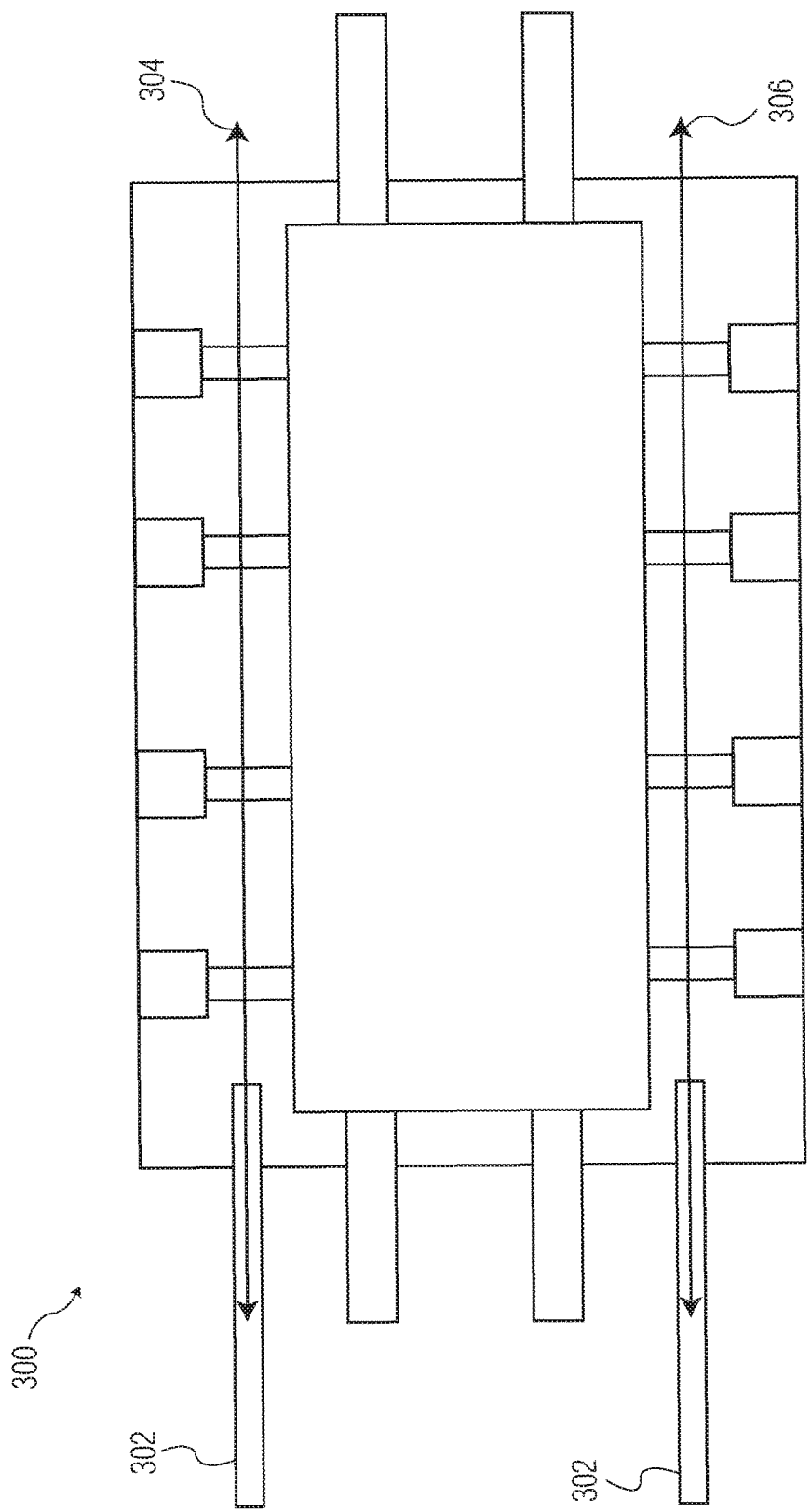
FIG. 3 is an example grooving map within the inner lead-frame portion.

FIG. 3 is an example cutting map 300 through the inner lead-frame portion 102 (after the outer portions of the terminals 106 have been electroplated) for separating the terminals 106 from the die-pad 104, so as to enable proper operation of the circuitry on the die and a circuit (not shown) to which the die circuits electrically communicate with.

The cutting map 300, in one example embodiment, identifies a first cutting path 304 and a second cutting path 306. The cutting paths 304, 306 specify how the terminal connectors 108 are to be cut so that the terminals 106 are electrically separated from the die-pad 104. In this example, the cutting paths 304, 306 take the form of two lines which are substantially parallel to each other. In other example embodiments, the paths could be of a different shape, and/or be discontinuous (i.e. dashed). Other paths 304, 306 may cut only some of the terminal connectors 108, instead of all of the terminal connectors 108 as shown. Alternative methods of interrupting the connection bar 108 may apply.

If a grooving device 302, such as a dicing blade, follows the cutting paths 304, 306, then a groove (e.g. shallow cut into the package) will be formed in the package. In one example embodiment, a distance from die-pad 104 to the terminals 106 is at least as wide as the cut 402, 404 width. Example dicing blades have widths ranging from 25 μm to 100 μm, or in some examples even more.

Figure 4:
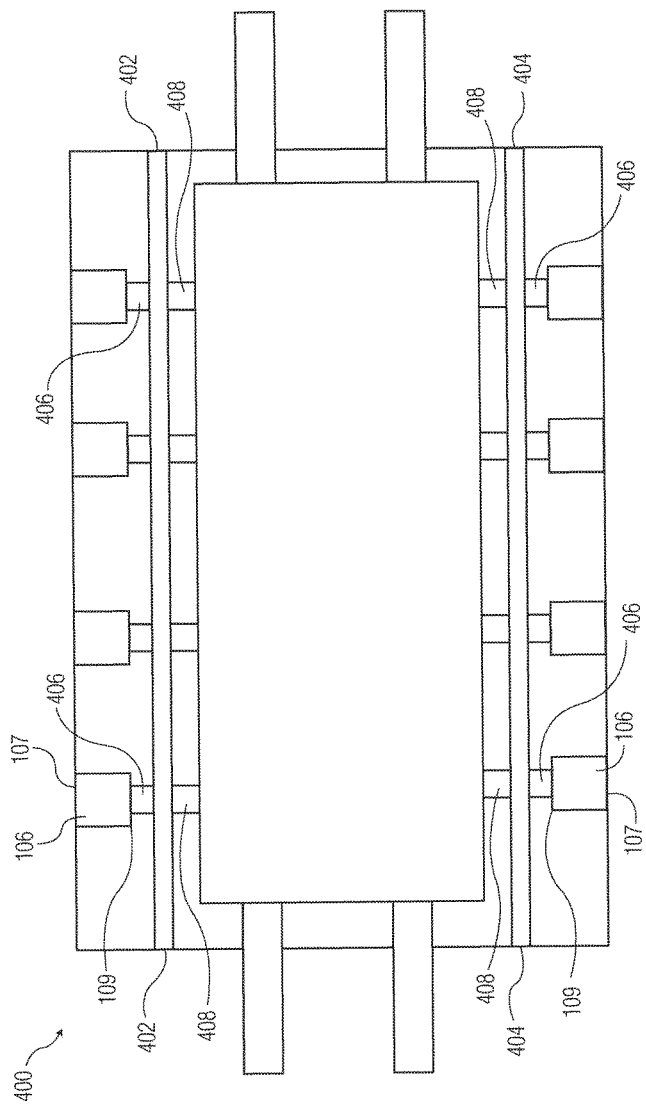
FIG. 4 is an example cut inner lead-frame portion after isolation cutting.

FIG. 4 is an example cut inner lead-frame portion 400 after isolation cutting. The cut inner lead-frame portion 400 shows a first cut 402 and a second cut 404. Both cuts 402, 404 separate and electrically isolate the terminals 106 from the die-pad 104, even though they are still mechanically connected via the plastic package body.

The cuts 402, 404 separate the terminal connectors 108 into a first partial terminal connector portion 406 connected to the inner terminal edge 109 of the terminal 106, and a second partial terminal connector portion 408 connected to the die-pad 104. In one example embodiment, the cuts 402, 404 expose an edge on both the first and second partial connector portions 406, 408. If the lead-frame was made of copper then the edges exposed will be copper, however the rest of the lead-frame, including the full edge of the outer terminal edge 107 of the terminal 106 will remain electroplated without any exposed copper. After sawing any needed postplating and/or isolation sawing (e.g. singulation) is performed.

As shown in FIG. 4, in this example, a first row of terminals 106 on a first side of the die-pad 104 are separated from the die-pad 104 by the first cut 402. A second row of terminals 106 on a second side of the die-pad 104 are separated from the die-pad 104 by the second cut 404.

Figure 5:
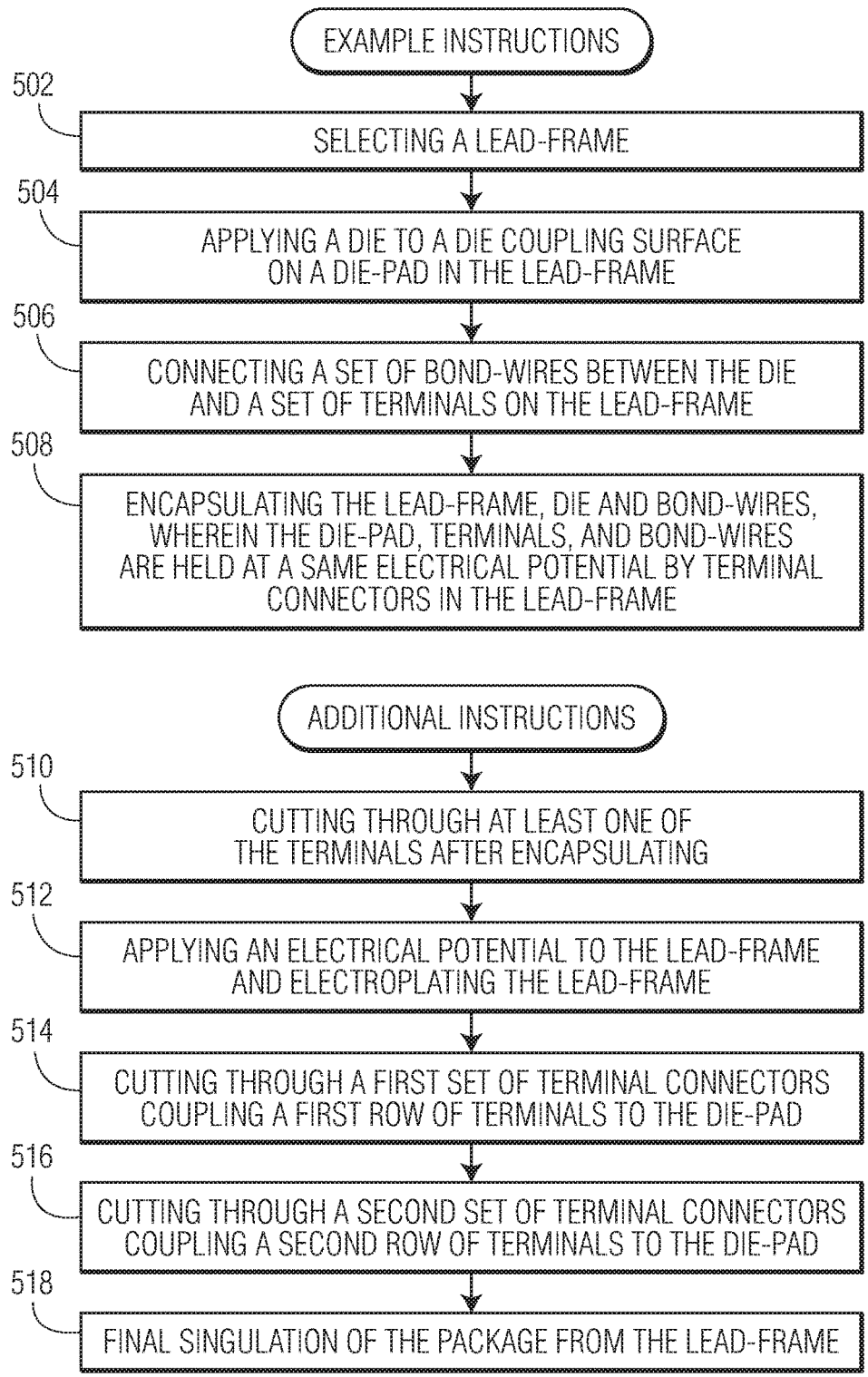
FIG. 5 is an example list of instructions for processing a lead-frame.

FIG. 5 is an example list of instructions for processing a lead-frame. The order in which the instructions are discussed does not limit the order in which other example embodiments implement the instructions. Additionally, in some embodiments the instructions are implemented concurrently.

A first example instruction begins in 502, by selecting a lead-frame. Next, in 504, applying a die to a die coupling surface on a die-pad 104 in the lead-frame. In 506, connecting a set of bond-wires between the die and a set of terminals 106 on the lead-frame. In 508, encapsulating the lead-frame, die and bond-wires, wherein the die-pad 104, terminals 106, and bond-wires are held at a same electrical potential by terminal connectors 108 in the lead-frame.

The instructions can be augmented with one or more of the following additional instructions, presented in no particular order, but which individually be implemented in a particular order if so specified.

The additional instructions include: 510, cutting through at least one of the terminals 107 after encapsulating; 512, applying an electrical potential to the lead-frame and electroplating at least the inner lead-frame portion; 514, cutting through a first set of terminal connectors 108 coupling a first row of terminals 106 to the die-pad 104; 516, cutting through a second set of terminal connectors 108 coupling a second row of terminals 106 to the die-pad 104; and 518, final singulation of the package from the lead-frame.

The instructions in the above Figures can be executed in any order, unless a specific order is explicitly stated. Also, those skilled in the art will recognize that while one example set of instructions have been discussed, the material in this specification can be combined in a variety of ways to yield other examples as well, and are to be understood within a context provided by this detailed description.

Figure 6:
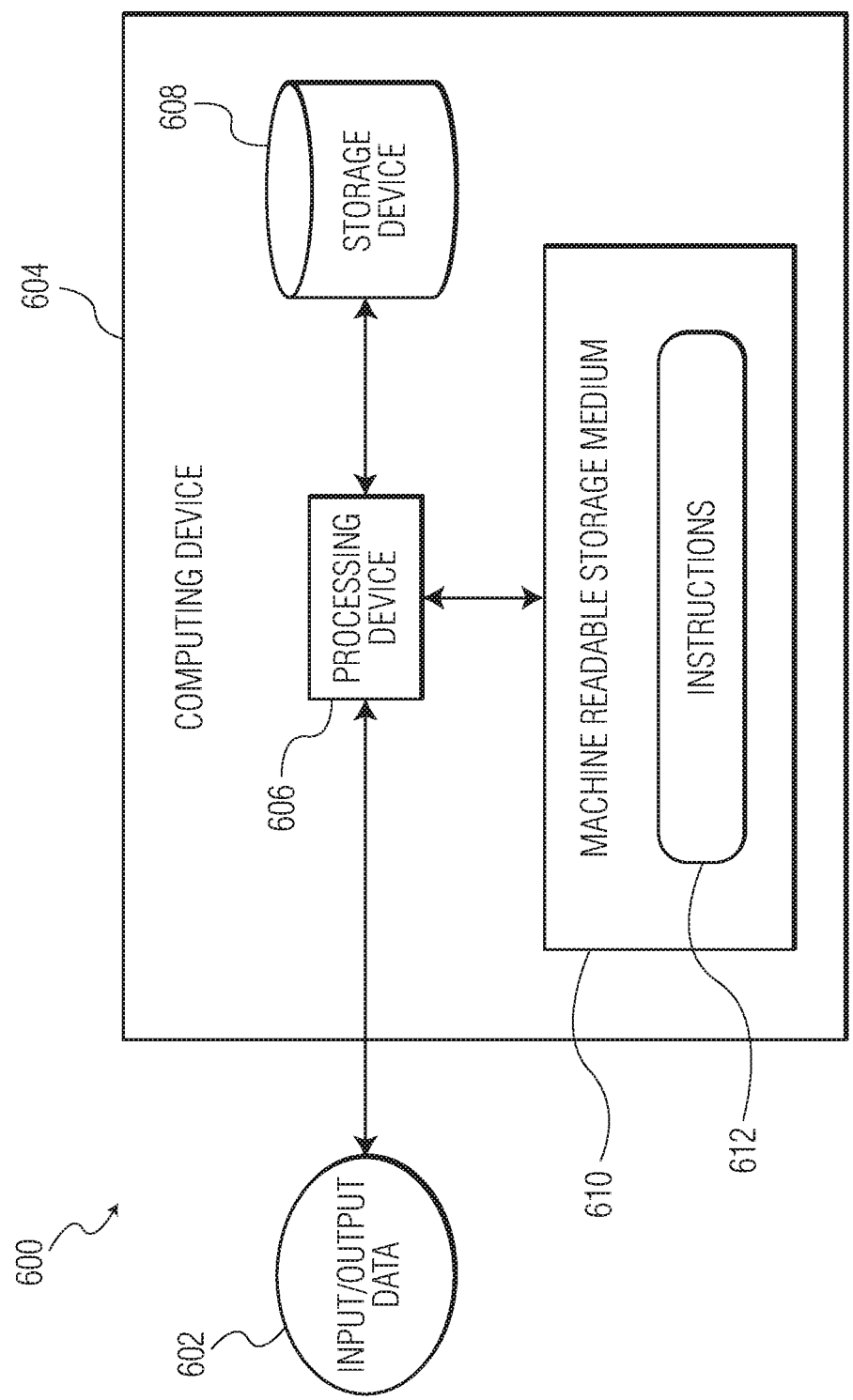
FIG. 6 is an example system for hosting instructions for processing the lead-frame.

FIG. 6 is an example system 600 for hosting instructions for processing the lead-frame. The system 600 shows an input/output data 602 interface with an electronic apparatus 604. The electronic apparatus 604 includes a processor 606, a storage device 608, and a non-transient machine-readable storage medium 610. The machine-readable storage medium 610 includes instructions 612 which control how the processor 606 receives input data 602 and transforms the input data into output data 602, using data within the storage device 608. Example instructions 612 stored in the machine-readable storage medium 610 are discussed elsewhere in this specification. The machine-readable storage medium in an alternate example embodiment is a non-transient computer-readable storage medium.

The processor (such as a central processing unit, CPU, microprocessor, application-specific integrated circuit (ASIC), etc.) controls the overall operation of the storage device (such as random access memory (RAM) for temporary data storage, read only memory (ROM) for permanent data storage, firmware, flash memory, external and internal hard-disk drives, and the like). The processor device communicates with the storage device and non-transient machine-readable storage medium using a bus and performs operations and tasks that implement one or more instructions stored in the machine-readable storage medium. The machine-readable storage medium in an alternate example embodiment is a computer-readable storage medium.

In some example embodiments the set of instructions described above are implemented as functional and software instructions embodied as a set of executable instructions in a non-transient computer-readable or computer-usable media which are effected on a computer or machine programmed with and controlled by said executable instructions. Said instructions are loaded for execution on a processor (such as one or more CPUs). Said processor includes microprocessors, microcontrollers, processor modules or subsystems (including one or more microprocessors or microcontrollers), or other control or computing devices. A processor can refer to a single component or to plural components. Said computer-readable or computer-usable storage medium or media is (are) considered to be part of an article (or article of manufacture). An article or article of manufacture can refer to any manufactured single component or multiple components. The non-transient machine or computer-usable media or mediums as defined herein excludes signals, but such media or mediums may be capable of receiving and processing information from signals and/or other transient mediums.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A lead-frame, comprising:
   a die-pad having a die coupling surface;
   a set of terminals each having an outer terminal edge and an inner terminal edge;
   wherein the outer terminal edge faces away from the die-pad and the inner terminal edge faces toward the die-pad; and
   a terminal connector having a first side coupled to the inner terminal edge and a second side coupled to the die-pad;
   a die coupled to the die coupling surface;
   a set of bond-wires coupling the die to the set of terminals;
   an encapsulant covering the lead-frame, die and bond-wires; and
   wherein the die-pad, at least two of the terminals, and at least two of the bond-wires are at a same electrical potential as the terminal connectors.

2. The lead-frame of claim 1:
   wherein the terminals include a bond-wire coupling surface.

3. The lead-frame of claim 1, wherein the set of terminals includes:
   a first terminal positioned on a first side of the die-pad; and
   a second terminal positioned on a second side of the die-pad opposite to the first side.

4. The lead-frame of claim 1, further comprising:
   a tie-bar coupled to the die-pad and configured to couple to a second die-pad.

5. The lead-frame of claim 1, further comprising:
   a second die-pad; and
   a tie-bar coupling the first die-pad to the second die-pad.

6. The lead-frame of claim 1, further comprising:
   an outer lead-frame coupled to the outer terminal edge of the terminals.

7. The lead-frame of claim 1, further comprising:
   an electroplated layer covering the lead-frame.

8. The lead-frame of claim 1:
   wherein the lead-frame includes an outer lead-frame portion;
   further comprising, a tie-bar coupling the first die-pad to the outer lead-frame portion.

9. The lead-frame of claim 1:
   wherein the set of terminals include a terminal width, and the terminal connector includes a connector width; and
   wherein the connector width is narrower than the terminal width.

10. A lead-frame, comprising:
    a die-pad having a die coupling surface;
    a set of terminals each having an outer terminal edge and an inner terminal edge;
    wherein the outer terminal edge faces away from the die-pad and the inner terminal edge faces toward the die-pad; and
    a terminal connector including:
      a first partial terminal connector portion coupled to the terminal;
      a second partial terminal connector portion coupled to the die-pad or a tie-bar; and
      wherein the first and second partial connector portions are separated by a first cut.

11. The lead-frame of claim 10:
    wherein the cut electrically isolates the terminal from the die-pad or the tie-bar.

12. The lead-frame of claim 10:
    wherein the cut is configured to expose an edge on both the first and second partial connector portions.

13. The lead-frame of claim 12:
    wherein the edges exposed are copper.

14. The lead-frame of claim 10:
    wherein the set of terminals includes a first row of terminals on a first side of the die-pad, and a second row of terminals on a second side of the die-pad;
    wherein the first row of terminals are separated from the die-pad by the first cut; and
    wherein the second row of terminals are separated from the die-pad by a second cut.

15. The lead-frame of claim 14:
    wherein the first and second cuts are substantially parallel to each other.

16. The lead-frame of claim 10:
    wherein an additional cut will expose an edge of the terminals to enable electroplating.

17. An article of manufacture comprising at least one non-transitory, tangible machine readable storage medium containing executable machine instructions for processing a lead-frame, wherein the instructions comprise:
    selecting a lead-frame, wherein the lead-frame includes:
      a die-pad having a die coupling surface;
      a set of terminals, surrounding the die-pad, each terminal having an outer terminal edge and an inner terminal edge;
      wherein the outer terminal edge faces away from the die-pad and the inner terminal edge faces toward the die-pad; and
      a set of terminal connectors each having a first side coupled to the inner terminal edge of one of the terminals and a second side coupled to the die-pad;
    applying a die to the die coupling surface;
    connecting a set of bond-wires between the die and the set of terminals;
    encapsulating the lead-frame, die and bond-wires; and
    wherein the die-pad, at least two of the terminals, and at least two of the bond-wires are held at a same electrical potential by the terminal connectors.

18. The article of claim 17, further including instructions for:
    electroplating; and
    cutting through at least one of the terminal connectors after encapsulating.

19. The article of claim 17:
    wherein the set of terminals includes a first row of terminals on a first side of the die-pad, and a second row of terminals on a second side of the die-pad;
    further including instructions for:
      cutting through a first set of terminal connectors coupling the first row of terminals to the die-pad; and
      cutting through a second set of terminal connectors coupling the second row of terminals to the die-pad.

20. The article of claim 17, further including instructions for:
    applying an electrical potential to the lead-frame; and
    electroplating the lead-frame.

* * * * *